Aug. 17, 1965 R. J. MARING 3,201,699
ELECTRONIC COUNTING APPARATUS WITH FEEDBACK CIRCUITS TO PREVENT MISCOUNTING
Filed Dec. 8, 1960
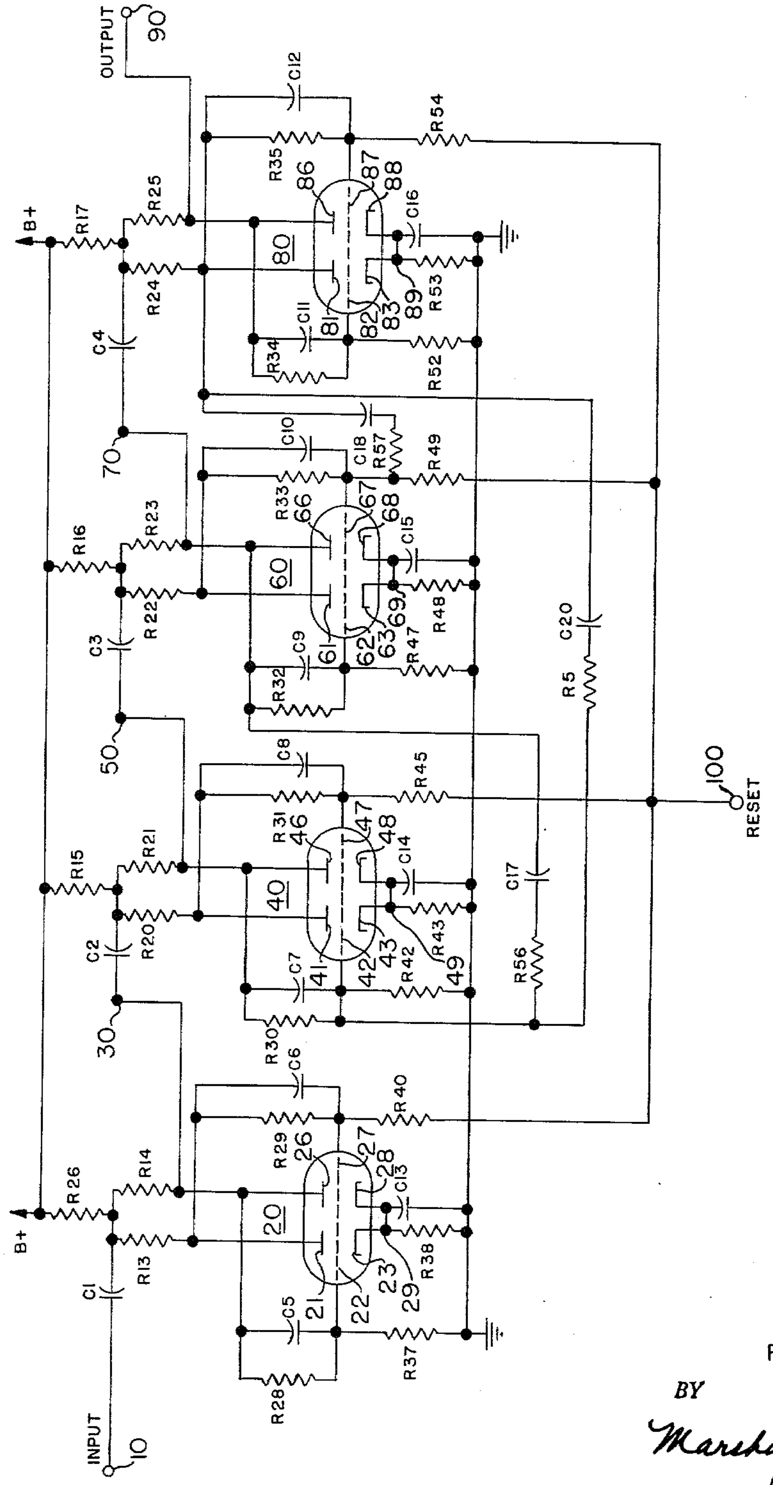
Fig. I
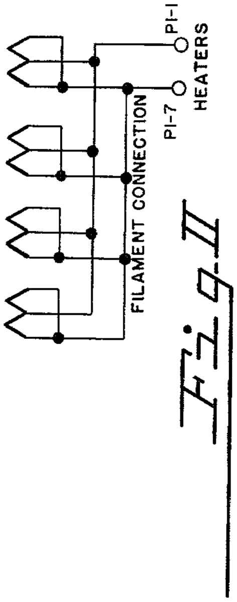
Fig. II
INVENTOR.
ROBERT J. MARING
BY
Marshall & Wilson
ATTORNEYS United States Patent Office 3,201,699
Patented Aug. 17, 1965

3,201,699
ELECTRONIC COUNTING APPARATUS WITH FEEDBACK CIRCUITS TO PREVENT MISCOUNTING

Robert J. Maring, Grand Rapids, Mich., assignor to Toledo Scale Corporation, Toledo, Ohio, a corporation of Ohio Filed Dec. 8, 1960, Ser. No. 74,610
2 Claims. (Cl. 328—45)

This invention relates to electronic counting apparatus in general and in particular to electronic counting apparatus in which feedback circuits are utilized to modify a binary counter to a decade counter or vice versa.

In electronic computers it has been most convenient to register and to perform mathematical operations upon bits of information in the binary form. That is, the binary system of counting is utilized which, since its base is two, may be represented by an electrical voltage of zero or a low voltage for the binary number zero and a relatively high voltage or the presence of a voltage for the binary number one. On occasion, however, decimal counting is more convenient than a binary system, as in a readout circuit in which an answer is required in the numbering system with a base of ten, or at intermediate points when operations are to be counted in the decimal system rather than in the binary system. Therefore, several decade counter units have been supplied in the prior art which utilize or are responsive to binary pulse inputs and are so connected to provide a decimal or a decade output.

Most of the standard counter units now in use utilize four flip-flop or bistable multi-vibratory circuits connected in cascade. Each flip-flop circuit usually comprises two tubes, transistors, electronic valves, etc., connected such that the flip-flop circuit has two stable states. That is, the first transistor or tube is conducting and the second cut off, or the first transistor or tube is cut off and the second conducting. The flip-flop circuit is designed to stay in either state indefinitely. When an input pulse of the proper polarity and magnitude is received the flip-flop circuit will change states such that the tube or transistor previously conducting is cut off and the tube or transistor previously not conducting is now conducting. Such a flip-flop stabilizes once the conduction states of the two tubes or transistors have reversed.

Since the flip-flop circuits are binary counting circuits, having outputs of either zero or one only, the connection of four such binary flip-flops in cascade provides a counter which will count to 16 before an output is received from the fourth flip-flop. To make the counter comprising the four flip-flops count only to ten, two feedback circuits generally are used. The output of the third flip-flop is connected to the input of the second flip-flop. Thus, when a fourth input pulse is received at the input of the counter the first three flip-flops will change states and the output of the third flip-flop is applied to the second flip-flop. This causes the second flip-flop to change states again which leaves the circuit in the same condition it would be in had six input pulses been received and no feedback utilized.

A second feedback circuit generally utilized connects the output of the fourth flip-flop to the input of the third flip-flop. If the counter already has the previously discussed feedback network from the third to the second flip-flop then the second feedback network coupling the fourth flip-flop to the third is operative on the sixth input pulse. That is, the sixth input pulse will change the states of all four flip-flops providing an output from the fourth flip-flop to the third flip-flop. Thus, as above, the third flip-flop will change states again as did the second flip-flop above on the fourth pulse and the outputs of the four flip-flop circuits will now appear as if twelve input pulses had been received instead of the six actually received. For the remainder of the cycle through ten input pulses the circuit is allowed to proceed normally. On the tenth input pulse all flip-flops will reset themselves to zero and the decade counter will be ready to count again.

Although the decade counter just described has worked satisfactorily, great care must be exercised in the adjustments of the time constants within the circuit to prevent a miscount. When such care must be exercised the counter is considered a "critical" counter which must be adjusted carefully and in which the components must fall within smaller tolerances. Rigorous attention also must be applied to the supply voltages and the magnitude and rise time of the various input and other pulses passing through the circuit.

Accordingly, it is an object of this invention to provide improved electronic counting apparatus.

It is a further object of this invention to provide an improved electronic counting apparatus in which feedback circuits are utilized to modify a counter from its normal mode of counting to a second system of counting.

It is a still further object of this invention to provide an improved binary to decimal counter.

Another object of this invention is to provide an improved binary to decimal counter in which the critical adjustments of the time constants between the various stages or flip-flops of the counter may be eliminated by the use of an additional feedback network.

Other objects, advantages and features of this invention will appear when the following description is taken in conjunction with the acompanying drawings, in which:

FIG. I illustrates a schematic diagram of a decade counter embodying the teachings of this invention; and FIG. II illustrates a schematic diagram of filament connections for the electronic devices of FIG. I.

Referring to the drawing there is schematically illustrated a decade counter comprising in general four flip-flops or bistable electronic circuits 20, 40, 60 and 80 connected in cascade.

The first flip-flop 20 comprises a dual triode tube having a left triode provided with an or first power electrode 21, a grid or control electrode 22 and a cathode or second power electrode 23. The right triode of the flip-flop 20 comprises an anode 26, a control electrode 27 and a cathode 28. The anode 21 is connected through a resistor R13 and a resistor R26 to a B+ supply which may be approximately 300 volts. The anode 21 is coupled to the control electrode 27 of the right triode through a parallel resistance R29 and capacitance C6 circuit. Similarly, the plate or anode 26 of the right triode is connected through a resistor R14 and the resistor R26 to the B+ supply The anode or plate 26 is also connected through a parallel resistance R28 and capacitance C5 circuit to the control electrode 22 of the left triode. The right triode anode 26 is also connected to the output terminal 30 from which the output of the first flip-flop is taken. The right and left triode cathodes 23 and 28 are connected together at terminal 29. The terminal 29 is connected through a parallel resistance R38 and capacitance C13 circuit to ground. The left control electrode 22 is connected to ground through the resistor R37. The right control electrode 27 is connected through resistor R40 to a reset terminal 100. An input pulse is to be applied to the first flip-flop at terminal 10 through an input capacitor C1 connected between terminal 10 and the common junction of the plate resistances R13 and R14.

The second flip-flop 40 comprises a left and right triode. The left triode comprises an anode 41, a control electrode 42 and a cathode electrode 43. The right triode comprises an anode or plate 46, a control electrode 47 and a cathode electrode 48. The anode 41 of the left triode is connected through plate resistance R20 and resistance R15 to the B+ supply. The anode 41 is also connected through a parallel resistance R31 and capacitance C8 circuit to the control electrode 47 of the right triode. Similarly, the anode 46 of the right triode is connected through plate resistance R21 and resistance R15 to the B+ supply. The anode 41 is also connected to the control electrode 42 of the left triode through a parallel resistance R30 and capacitance C7 circuit. The output of the flip-flop 40 appears at terminal 50 which is connected to anode 46. The cathodes 43 and 48 of the left and right triodes are connected together at terminal 49. Terminal 49 is connected to ground through a parallel resistance R43 and capacitance C14 circuit. The left triode control electrode 42 is connected to ground through resistance R42. The right control electrode 47 is connected through a resistance R45 to the reset terminal 100. The output of the first flip-flop 20 at terminal 30 is coupled through capacitor C2 to the common junction of the plate resistances R20 and R21.

The third flip-flop 60 comprises a left triode and a right triode. The left triode includes an anode 61, a control electrode 62 and a cathode 63. The right triode includes an anode 66, a control electrode 67 and a cathode 68. The anode 61 is connected through a plate resistor R22 and a resistance R16 to the B+ supply. The anode 61 is also connected through a parallel resistance R33 and capacitance C10 circuit to the control electrode of the right triode. Similarly, the anode 66 is connected through a plate resistance R23 and the resistor R16 to the B+ supply. The anode 66 is also connected through a parallel resistance R32 and capacitance C9 circuit to the control electrode 62 of the left triode. The output of the third flip-flop 60 is taken from the plate 66 and appears at terminal 70 which is connected thereto. The cathodes 63 and 68 are connected at a common junction 69. The junction or terminal 69 is connected to ground through a parallel resistance R48 and capacitance C15 circuit. The left control electrode 62 is connected through a resistance R47 to ground. The right control electrode 67 is connected through a resistance R49 to the reset terminal 100.

A feedback circuit from the third flip-flop circuit 60 to the second flip-flop 40 comprises a serially connected resistance R56 and capacitance C17 connected between the output terminal 70 or the plate 66 of the third flip-flop 60 and the left control electrode 42 of the second flip-flop 40. The flip-flop 60 receives an input from the flip-flop 40 through a coupling capacitor C3 connected between the output terminal 50 and the common junction of the plate resistances R22 and R23 of the flip-flop 60.

The fourth flip-flop 80 comprises a left triode and a right triode. The left triode includes an anode 81, a control electrode 82 and a cathode 83. The right triode includes an anode 86, a control electrode 87, and a cathode 88. The anode 81 of the left triode is connected through a plate resistance R24 and a resistor R17 to the B+ supply. The anode 81 is also connected through a parallel resistance R35-capacitance C12 circuit to the control electrode 87 of the right triode. Similarly, anode 86 is connected through plate resistance R25 and the resistance R17 to the B+ supply. The anode 86 is also connected through a parallel resistance R34-capacitance C11 circuit to the control electrode 82 of the left triode. The anode 86 is also connected to the output terminal 90 providing the output for the decade counter. The cathodes 83 and 88 are connected to terminal 89. The terminal 89 is connected to ground through a parallel resistance R53 and capacitance C16 circuit. The left control electrode 82 is connected to ground through a resistance R52. The right control electrode 87 is connected to a resistance R54 to the reset terminal 100.

The standard feedback circuit from the fourth flip-flop 80 to the third flip-flop 60 comprises connecting the plate 81 through a serially connected capacitance C18 and resistance R57 to the right control electrode 67 of the flip-flop 60. The flip-flop 80 receives an input from the flip-flop 60 from the terminal 70 through a coupling capacitor C4 connected to the common junction of the plate resistances R24 and R25.

The decade counter circuit just described is typical of standard decade counters available on the market today. Such decade counters work satisfactorily under most conditions but are "critical" in their time constant adjustments so that the feeding back of the signals from the third to the second flip-flop and the feeding back of the signal from the fourth to the third flip-flop will not initiate a miscounting action in the circuit because of the reversal of the state of the third flip-flop in response to the pulse fed back from the fourth flip-flop.

The operation of the above decade counter is as follows. As was stated hereinbefore each of the flip-flop circuits has two stable states: either the left triode is conducting and the right triode is cutoff, or the left triode is cutoff and the right triode conducting. The flip-flop circuits will change states only upon receipt of an input pulse of the proper polarity and magnitude. When such an input pulse is received the conduction states will change. Once the change in conduction states is realized the coupling network between the respective opposite plates and control electrodes stabilizes the circuit as first set forth in the well-known Eccles-Jordan circuit. The Eccles-Jordan circuit is a two-stage direct-coupled amplifier in which the output of the second stage is connected to the input of the first stage. Conduction states in a basic flip-flop such as shown in the drawing may be switched by applying a positive pulse of sufficient magnitude to the control electrode of the non-conducting tube or the application of a negative pulse of sufficient magnitude to the control electrode of the conducting tube.

Before operation of the decade counter is initiated a reset pulse is applied to the terminal 100 which is connected to each of the right control electrodes 27, 47, 67, and 87 through the reset resistors R40, R45, R49, and R54 causing all of the right triodes to conduct. Since the right triodes are conducting and the output for each flip-flop is taken from the plate of the right triodes no voltage or a very low voltage is available across the right triodes to provide an output. That is, the very small voltage drop across the tube of the right triode is the zero or no output normal signal representing the binary number zero. The left triodes of all of the flip-flops are now non-conducting.

Upon application of a negative pulse input to the input terminal 10 of sufficient magnitude the right triode of the flip-flop 20 will stop conducting and the left triode will start conducting. Therefore, an output now appears across the right-hand triode and at the terminal 30. The application of a second input pulse reverses conduction states of the flip-flop 20 so that the output at the terminal 30 goes from a relatively high voltage to a relatively low voltage as the right-hand triode again starts conducting. The change in voltage at terminal 30 from a high voltage to a low voltage is passed through coupling capacitor C2 as a negative pulse and is applied as an input pulse to the flip-flop 40. The application of a negative input pulse to the flip-flop 40 stops the conduction of the right-hand triode and starts conduction of the left-hand triode. Thus, an output signal voltage will now appear at the plate 46 of the right-hand triode and at the output terminal 50 for the flip-flop 40.

The receipt of a third input pulse at terminal 10 is operative to reverse the conduction states of flip-flop 20 such that an output voltage appears at terminal 30. The change from a low voltage to a high voltage at the output terminal 30 produces a positive pulse which is not operative to change conduction states of the second flip-flop 40. Therefore, at this time there is an output voltage from the flip-flop 20 and an output voltage from the flip-flop 40 at the terminals 30 and 50, respectively.

The receipt of a fourth negative input pulse at terminal 10 flips or reverses flip-flop 20 changing its output voltage from a relatively high voltage to a relatively low voltage at output terminal 30. This change in voltage at terminal 30 passes a negative pulse through coupling capacitor C2 to flip-flop 40 causing it also to change states such that the output voltage at the terminal 50 drops from a relatively high voltage to a relatively low voltage. The drop in voltage at output terminal 50 passes a negative pulse through coupling capacitor C3 to the third flip-flop 60 causing it to change conduction states and providing an output voltage at the output terminal 70 of the flip-flop 60 in accordance with previously described action. The stopping of the conduction of the right-hand triode of flip-flop 60 causes the voltage on the plate 66 to rise feeding back a positive pulse through the series resistance R56 and capacitance C17 circuit to the control electrode 42 of the left-hand triode of the flip-flop 40. The application of a positive pulse to the non-conducting left-hand triode of the flip-flop 40 causes the second flip-flop 40 to again reverse conduction states such that an output now appears again at the terminal 50 from the flip-flop 40. That is, flip-flop 20 has reversed, flip-flop 40 has reversed, flip-flop 60 has reversed feeding back a positive pulse signal to the second flip-flop 40 causing it to reverse again. Therefore, after the fourth input pulse the first flip-flop 20 has a relatively low output voltage, the second flip-flop 40 has a relatively high output voltage, the third flip-flop 60 has a relatively high output voltage and the fourth flip-flop 80 still has no output voltage.

Receipt of the fifth negative input pulse at the terminal 10 is operative only to reverse the conduction state of the first flip-flop 20. Since the change in voltage at the output terminal 30 near the first flip-flop is from a relatively low voltage to a relatively high voltage, the positive pulse resulting therefrom is not operative to change the conduction states of the second flip-flop 40. Since the second flip-flop 40 does not change conduction states none of the succeeding flip-flops change conduction states.

Upon receipt of the sixth negative input pulse the first flip-flop reverses going from a relatively high output voltage to a relatively low output voltage. The negative pulse resulting therefrom causes the second flip-flop 40 to reverse with the output voltage at the terminal 50 going from a relatively high output voltage to a relatively low output voltage. The negative pulse resulting therefrom causes the third flip-flop 60 to reverse such that its output at the terminal 70 goes from a relatively high voltage to a relatively low voltage. The negative change in voltage at terminal 70 is passed as a negative pulse through coupling capacitor C4 to the flip-flop 80 causing the flip-flop 80 to change conduction states so that the output at the output terminal 90 is now a relatively high voltage.

The change in conduction states of the fourth flip-flop 80 is operative to cause a lowering of voltage on plate 81 of the left-hand triode as it starts to conduct. This is fed back as a negative pulse through the feedback circuit comprising the serially connected capacitance C18 and resistance R57 to the right-hand control electrode of the third flip-flop 60. Since the third flip-flop 60 had just changed states so that the right-hand triode is now conducting the application of a negative pulse to the control electrode 67 of the right-hand triode is operative to cause the third flip-flop to change states again.

It is at this point in the decade counter where the difficulty arises on maintaining a very critical adjustment of the time constants on the feedback circuits. If the time constants are not correctly adjusted the second reversal of the third flip-flop 60 in response to the receipt of the sixth negative input pulse at terminal 10 would cause a reversal of the second flip-flop 40 through the feedback circuit between the third flip-flop 60 and the second flip-flop 40 previously described.

To remove the decade counter from the "critical" adjustment category a third feedback circuit is applied from the plate 81 of the left-hand triode of the fourth flip-flop 80 through serially connected capacitance C20 and resistance R5 to the control electrode 42 of the left-hand triode of the second flip-flop 40. As was above described the feedback from the third flip-flop 60 is also connected to the control electrode 42 of the left-hand triode of the second flip-flop 40. However, a positive pulse was fed back from the third flip-flop 60 to the control electrode 42 to cause it to change conduction states of the second flip-flop 40. As was just described a negative pulse is available caused by the stopping of conduction of the left-hand triode of the fourth flip-flop 80 such that the voltage on the anode 81 drops sharply. Thus, by connecting this negative feedback pulse which occurs when the flip-flop 80 changes conduction states to the same point as the positive feedback pulse fed back from the third flip-flop 60, that is, the control electrode 42 of the left-hand triode of flip-flop 40, the two pulses fed back cancel each other preventing any change in conduction states of the second flip-flop 40 as the result of the change of conduction states of the third flip-flop 60 after the sixth input pulse is received.

To thus remove the standard decade counter shown in the drawing from the "critical" time constant adjustment discussed hereinbefore allows it to be placed in circuits with no need for further adjustments of said time constants. The components utilized in the decade counter in the feedback circuits and other circuits which cooperate to provide the various magnitudes of pulses and rate of rise of the pulses, when affecting the feedback of pulses to provide a total of ten count for four cascaded flip-flops, whose tolerance limits are not as critical as required before. Therefore, the decade counter is also less sensitive to ambient temperature changes in causing a miscount because the change in the values of the components, resulting from extreme ambient temperature changes, stays well within tolerance limits.

After the sixth input pulse it may be seen that the first flip-flop 20 has a relatively low output voltage, the second flip-flop 40 has a relatively low output voltage, the third flip-flop 60 has a relatively high output voltage, and the fourth flip-flop 80 also has a relatively high output voltage. The remainder of the operation of the counter proceeds as known in the art to provide the remainder of the counts to ten. That is, the receipt of the seventh negative input pulse causes only the first flip-flop 20 to reverse its conduction states. The receipt of the eighth negative input pulse at terminal 10 causes the first flip-flop to reverse conduction states such that the voltage on the terminal 30 goes from a relatively high voltage to a relatively low voltage which causes the second flip-flop 40 to reverse its conduction states. Upon receipt of the ninth negative input pulse at the terminal 10 only the first flip-flop 20 reverses its conduction state with no effect on the remainder of the counter because the voltage at terminal 10 rises from a relatively low voltage to a relatively high voltage. After receipt of the ninth negative input pulse at terminal 10 all four flip-flops have relatively high voltages at their output. Thus it may be seen that the application of the tenth negative input pulse to the input terminal 10 will cause all four flip-flops to reverse conduction states and be reset again to zero.

In summary there has been described an electronic counter comprising a plurality of bistable circuits, each having two output states. Each bistable circuit, except a terminal bistable, has an output means coupled to an input means of a succeeding bistable circuit to form a counting chain. First feedback means are utilized coupling an output of one of said bistables to an input means of another bistable whereby an output signal from said one bistable causes a change in output states of said other bistable. Second feedback means are utilized coupling an output of a third bistable to an input means of said other bistable whereby the occurrence of outputs on both of the feedback circuits is operative to prevent a change in output states of said other bistable.

The feedback means referred to above may be defined as first feedback means connecting an output of one of said bistable circuits to an input means of a preceding bistable circuit whereby an output signal from said one bistable circuit is operative to cause said preceding bistable circuit to change output states. Further, second feedback means connect an output of another of said bistable circuits to an input means of the said preceding bistable circuit whereby the occurrence of outputs from both feedback circuits at said input means is operative to prevent said preceding bistable circuit from changing output states.

More specifically the electronic counter may be defined as a plurality of bistable circuits, each of said bistable circuits having input means and output means providing two output states. There are means coupling an output of first, second, and third bistable circuits to the inputs of said second, said third and a fourth of said bistable circuits, respectively. First feedback means are utilized coupling an output of said third bistable to the input means of said second bistable. Second feedback means are utilized coupling an output from said fourth bistable to said input means of said second bistable. The simultaneous occurrence of outputs from both feedback circuits is operative to prevent a change in output states of said second bistable.

A more limited description of the electric decade impulse counter defines the counter as comprising first, second, third and fourth bistable flip-flop circuits. Each of the bistable circuits includes input means and output means. Each of the bistable circuits also includes an input tube and an output tube. Means couple the outputs of the first, second and third bistable circuits to the input means of the second, third, and fourth bistable circuits, respectively. Each of the input and output tubes of the bistable circuits have two conductive states. First feedback means connect an output of said output tube of the third bistable circuit to the input means of the second bistable circuit. Second feedback means connect an output of said input tube of said fourth bistable circuit to said input means of said third bistable circuit. Third feedback means connect an output of said input tube of said fourth bistable circuit to said input of said second bistable circuit. A signal from the third feedback circuit is operative to cancel the effect of a signal from the first feedback circuit.

Specifically defining the embodiment shown there is illustrated an electric decade pulse counting chain comprising first, second, third, and fourth bistable flip-flops. Each of said bistables include an input tube and an output tube. Each of said tubes have two conductive states. Means are provided for connecting a power source at positive and ground terminals. Anode resistors connect the anodes of said tubes and the positive terminal of said current source. Cathode resistors connect the cathodes of said tubes to said ground terminal. Circuit means are provided connecting each control electrode of each tube of a bistable to an anode of the other tube of each bistable. Means are provided coupling the output tubes of said first, second, and third bistables to the input tubes of said second, third, and fourth bistables including capacitor means connected between the anode of an output tube and a junction of anode resistors of a succeeding bistable. Feedback means including a first circuit coupling an anode of an output tube of said third bistable to a control electrode of an input tube of said second bistable. A second feedback circuit couples an anode of an input tube of said fourth bistable to a control electrode of an input tube of said second bistable. The simultaneous occurrence of signals from said first and second feedback circuit is operative to cancel the effects of each other.

In conclusion it is pointed out that while the illustrated example constitutes a practical embodiment of my invention, I do not limit myself to the exact details shown, since modification of the same may be made without departing from the spirit of this invention.

Having described the invention, I claim:

1. In an electronic counter, in combination; a plurality of bistable circuits, each having two output states; each bistable circuit, except a terminal bistable, having an output means coupled to an input means of a succeeding bistable circuit to form a counting chain; first feedback means coupling an output of one of said bistables to a point in an input means of another bistable whereby an output signal from said one bistable causes a change in output states of said other bistable; and second feedback means alternating current coupling an output of a third bistable to said point in the input means of said other bistable whereby the occurrence of outputs on both said feedback means is operative to prevent a change in output states of said other bistable.

2. An electric decade impulse counter comprising first, second, third and fourth bistable flip-flop circuits; each of said circuits including input means and output means; means coupling the outputs of said first, second and third bistable circuits to the input means of said second, third and fourth bistable circuits, respectively; first feedback means capacitive connecting an output of said third bistable circuit to a point in said input means of said second bistable circuit; second feedback means capacitive connecting an output of said fourth bistable circuit to said input means of said third bistable circuit; and third feedback means capacitive connecting an output of said fourth bistable circuit to said point in the input of said second bistable circuit.

References Cited by the Examiner

UNITED STATES PATENTS

| | | | |
|---|---|---|---|
| 2,503,662 | 4/50 | Flowers | 328—49 |
| 2,540,024 | 1/51 | Bergfors | 328—45 |
| 2,678,390 | 5/54 | Abelew | 328—49 |
| 2,756,934 | 7/56 | Ziffer | 328—42 |

FOREIGN PATENTS

| | | |
|---|---|---|
| 1,236,907 | 6/60 | France. |

OTHER REFERENCES

"Decade Counter," by Irving Gottlieb, Wireless World, May 1954, pages 234–236.

JOHN W. HUCKERT, *Primary Examiner.*

GEORGE N. WESTBY, *Examiner.*